United States Patent
Ismail (10) Patent No.: US 7,589,547 B2
(45) Date of Patent: Sep. 15, 2009

(54) FORKED PROBE FOR TESTING SEMICONDUCTOR DEVICES

(75) Inventor: Salleh Ismail, El Monte, CA (US)

(73) Assignee: Touchdown Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/855,094

(22) Filed: Sep. 13, 2007

(65) Prior Publication Data

US 2009/0072850 A1    Mar. 19, 2009

(51) Int. Cl.
*G01R 31/02* (2006.01)
(52) U.S. Cl. ..................................... 324/762
(58) Field of Classification Search ............... 324/754, 324/762; 439/862, 66–72
See application file for complete search history.

(56) References Cited

U.S. PATENT DOCUMENTS

| | | | |
|---|---|---|---|
| 5,286,208 A * | 2/1994 | Matsuoka | 439/72 |
| 6,268,015 B1 | 7/2001 | Mathieu et al. | |
| 6,414,501 B2 * | 7/2002 | Kim et al. | 324/754 |
| 6,491,968 B1 * | 12/2002 | Mathieu et al. | 29/842 |
| 6,616,966 B2 | 9/2003 | Mathieu et al. | |
| 6,672,875 B1 | 1/2004 | Mathieu et al. | |
| 6,771,084 B2 * | 8/2004 | Di Stefano | 324/754 |
| 6,811,406 B2 * | 11/2004 | Grube | 439/66 |
| 7,010,854 B2 * | 3/2006 | Eldridge et al. | 29/832 |
| 7,063,541 B2 * | 6/2006 | Grube et al. | 439/66 |
| 7,377,788 B2 * | 5/2008 | Hasegawa | 439/66 |
| 2002/0027444 A1 | 3/2002 | Jones et al. | |
| 2004/0223309 A1 | 11/2004 | Haemer et al. | |
| 2006/0043995 A1 * | 3/2006 | Williams et al. | 324/762 |
| 2006/0192581 A1 * | 8/2006 | Lee | 324/762 |
| 2008/0074132 A1 * | 3/2008 | Fan et al. | 324/762 |

OTHER PUBLICATIONS

International Search Report and Written Opinion of the International Searching Authority, dated Apr. 17, 2008.

\* cited by examiner

*Primary Examiner*—Ha Tran T Nguyen
*Assistant Examiner*—Richard Isla Rodas
(74) *Attorney, Agent, or Firm*—Manuel F. De La Cerra (57) ABSTRACT

A novel forked probe design for use in a novel probe card is presented that comprises a forked bending element that more efficiently stores displacement energy. Specifically, the novel probe card comprising a substrate and a forked probe connected to the substrate. The forked probe includes a base that is connected to the substrate and a forked bending element connected to the base, wherein the forked bending element comprises at least a first prong connected to a second prong through a prong connecting structure and a handle connected to the prong connecting structure. Connected to the first prong is the probe tip that is adapted to make contact with the DUT. Refinements to the probe card include that the first and second prongs are adapted to bend such that each prong elastically stores a portion of the displacement energy when the probe tip contacts the DUT. Also, the forked bending element may be manufactured using photolithography and using layered photolithography. Each prong may be comprised of different materials. And the forked bending element may be comprised of a nickel alloy. Also, the first prong may be constructed to be stiffer than the second prong, which may yield a shorter scrub length. The stiffness of the prongs may be manipulated by altering the geometry and/or material of the prongs.

24 Claims, 11 Drawing Sheets

FIGURE 3C
(SAME AS FIGURE 11B)
Prior Art

FORKED PROBE FOR TESTING SEMICONDUCTOR DEVICES

1. FIELD OF THE INVENTION

The present invention relates to devices for testing semiconductor devices and more particularly to the design of probe contactors for such testing.

2. BACKGROUND OF THE INVENTION

Integrated circuits are made in a bulk parallel process by patterning and processing semiconductor wafers. Each wafer contains many identical copies of the same integrated circuit referred to as a "die." It may be preferable to test the semiconductor wafers before the die is cut into individual integrated circuits and packaged for sale. If defects are detected the defective die can be culled before wasting resources packaging a defective part. The individual die can also be tested after they have been cut into individual integrated circuits, either before or after being packaged (here "packaged" refers to the process of being connected to an electrical interconnect package that protects the die and allows for assembly onto a wiring board).

To test a wafer or an individual die—commonly called the device under test or DUT—a probe card is commonly used which comes into contact with the surface of the DUT. The probe card generally contains three unique characteristics: (1) an XY array of individual probes that move in the Z direction to allow contact with the die pad; (2) an electrical interface to connect the card to a circuit test apparatus; and (3) a rigid reference plane defined in such a way that the probe card can be accurately mounted in the proper location. When the probe card is brought in contact with the die pad, the Z-direction movement allows for a solid contact with the probe tip. The probe card ultimately provides an electrical interface that allows a circuit test apparatus to be temporarily connected to the DUT. This method of die testing is extremely efficient because many die can be tested at the same time. To drive this efficiency even higher, probe card manufactures are making larger probe cards with an ever-increasing numbers of probes.

Figure 6A:
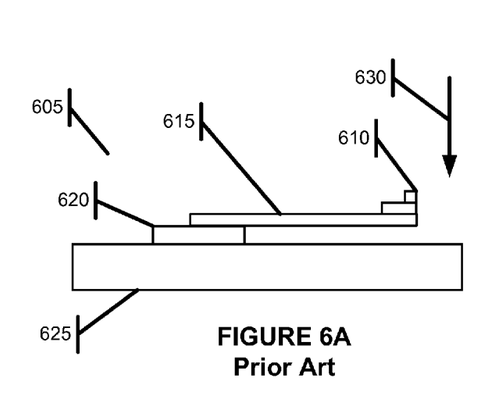
FIGS. 6A and 6B illustrate a cantilever probe.
Figure 6B:
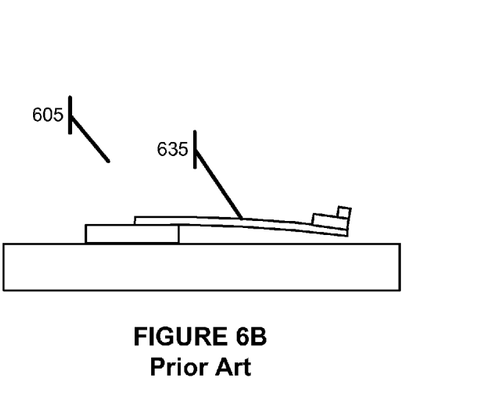

Currently two major types of probe designs are used to test a semiconductor die—cantilever and torsional FIGS. 6A and 6B illustrate a conventional cantilever probe. The probe (605) comprises a probe tip (610), a bending element (615), and a probe base (620), which is mounted to a substrate (625). This entire structure is referred to herein as the probe card. The DUT is generally moved relative to the fixed probe card in the Z-direction (depicted by arrow 630) causing the bending element (615) to bend allowing the probe tip (610) to come into contact with the die pad that is under test. FIG. 6B illustrates how the probe bending element (635) bends while being brought into contact with the die. As an individual probe travels to make contact with the DUT contact pad (this event is called a touchdown), the probe tip scrubs the contact pad, which perfects an electrical contact with the die such that testing can commence. The die contact pads, which are typically aluminum (but may be Gold, Solder, and increasingly Copper), are often coated with a thin layer of aluminum oxide, or other undesired passivating coating, and the probe tip must cut through the coating to perfect the electrical connection. Once testing is complete, the probe (605) is moved away from the die pad and the probe springs back to its original position.

The cantilever design, however, has several shortcomings. Typical cantilever probes are designed with long bending elements, which during touchdown, the probe tip presents a smaller tip contact angle (as compared to the same sized tip on a typical torsion probe design). This results in a larger tip contact area and a larger probe force is thus needed to pierce the aluminum oxide layer. When you multiply this force by the hundreds or thousands of probes on a probe card, the probe card must be engineered to accommodate significant forces, which usually means reinforcing the probe card components, which in turn increases probe card costs and test system complexity.

Figure 7A:
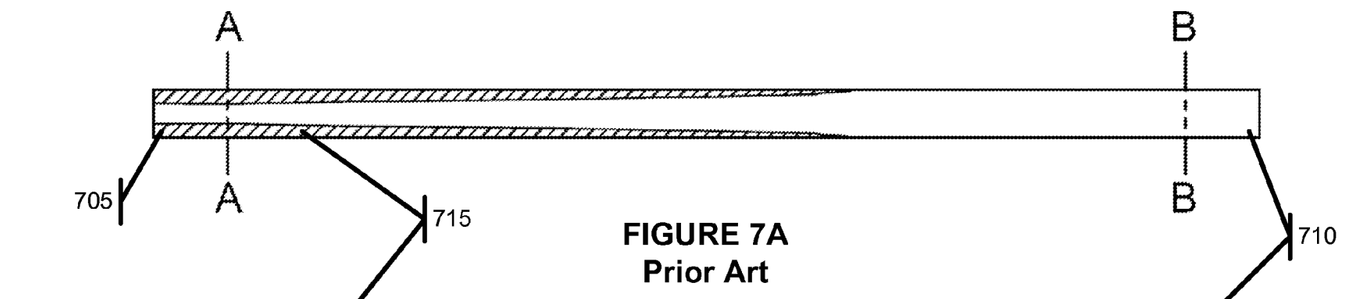
FIGS. 7A and 7B are a length-wise cross-section and width-wise cross-sections, respectively, of the stresses experienced by the bending element of a cantilever probe.
Figure 7B:
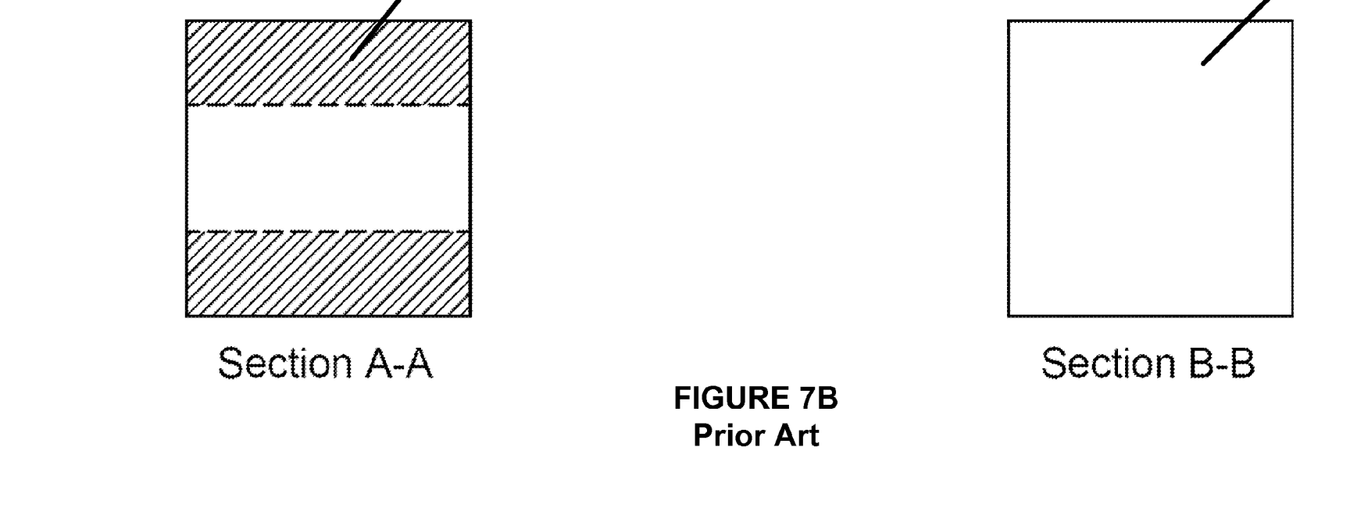

Another shortcoming is the inefficient distribution of stresses. During touchdown, a cantilever probe bends, which creates stresses on the probe that appear concentrated at the top and bottom surfaces of the bending element near the probe base end of the probe. FIG. 7A illustrates a length-wise cross-sectional view of the stresses experienced by the bending element of a cantilever probe, while FIG. 7B illustrates the width-wise cross-sectional views (Sections A-A and B-B) of the stresses at each end of the element. The left side of the figure, near Section A-A, (indicated by part 705) is the part of the bending element that is near the probe base, with the right side, near Section B-B, (part 710) near the probe tip. The area of the bending element that experiences stresses which are greater than 50% of the maximum stress is shown hatched (815). The corresponding volume of the bending bar that experiences greater than 50% of maximum stress is about 25% of the total cantilever bar volume, and that volume is localized near the probe base (705). The opposite side of the bending bar (710) experiences very low stress. It is clear from FIGS. 7A and 7B that the stress distribution is inefficient because only small portions of the bending element absorb the stress. And it is in these small portions where the probe is more likely to fail forcing manufacturers to strengthen the bending element (often by widening at the probe foot) to reduce stress and prevent failures.

Figure 8:
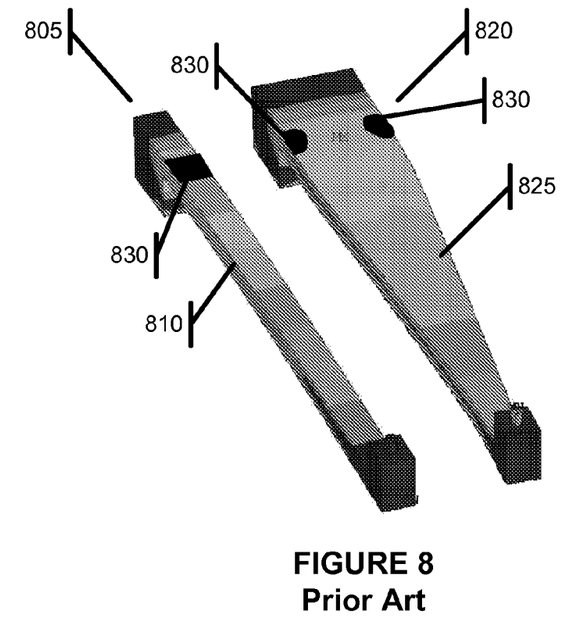
FIG. 8 illustrates the forces experienced by a cantilever probe with a constant width bending element and a widened bending element.
Figure 9:
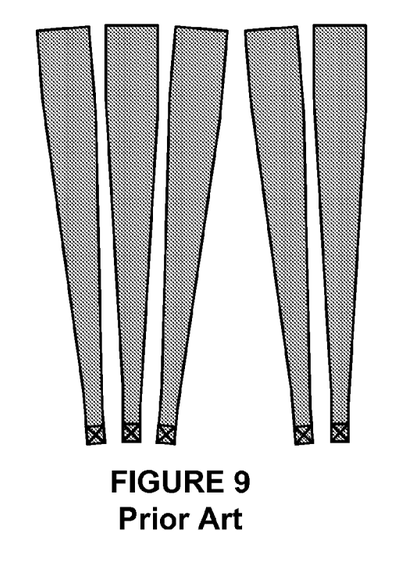
FIG. 9 illustrates the packing density of a cantilever probe with a widened bending element.

Shown in FIG. 8 is a cantilever probe (805) with a constant width in the bending element (810). As is shown in the dark area (815), the cantilever probe (805) experiences the most amount of stress at the probe base. Cantilever probe (820) in FIG. 8 has a bending element (825) that is wider at the probe base and tapers to the probe tip. As shown by the dark area (830), the stress experienced by the bending element (825) is much less than in the non-widened design. This design, however, is not without costs. A wider bending element near the probe base adversely affects the packing density of the probe card as shown in FIG. 9. The inefficient packing density renders it difficult to scale probe layout and design to test finer pitch DUTs (where the pads are closer together).

Figure 6C:
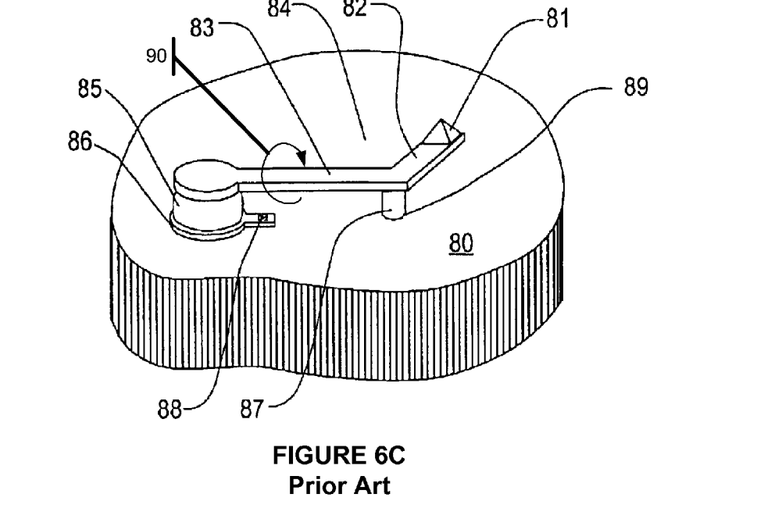
FIG. 6C illustrates a torsional probe.

The second type of probe is based on a torsional design which was developed to overcome some of these drawbacks. For example, U.S. Pat. No. 6,426,638 describes a torsion spring design. FIG. 6C illustrates a torsional probe design. As the probe tip (81) comes in contact with the DUT contact pad, it moves flexibly in response to force applied vertically to the tip (81). Vertical movement of the tip (81) depresses the arm (82) and torsionally flexes the torsion element (83) in the direction indicated by arrow (90). The torsion element (83) serves as a torsional spring, thereby impressing a restoring force on the tip (81).

Torsional designs have some advantages over cantilever designs. Typical torsional probes are designed with short arms, which during touchdown, the probe tip presents a larger tip contact angle (as compared to the same sized tip on a typical cantilever probe design). This results in a smaller tip contact area and a smaller probe force is thus needed to pierce the aluminum oxide layer, which in turn, reduces the overall force exerted by the probe card. Reduced overall force is advantageous because the probe card does not need to be reinforced as much as a comparable cantilever design, thereby reducing manufacturing costs or allowing more probes to be built on a card.

Figures 10A, 10B:
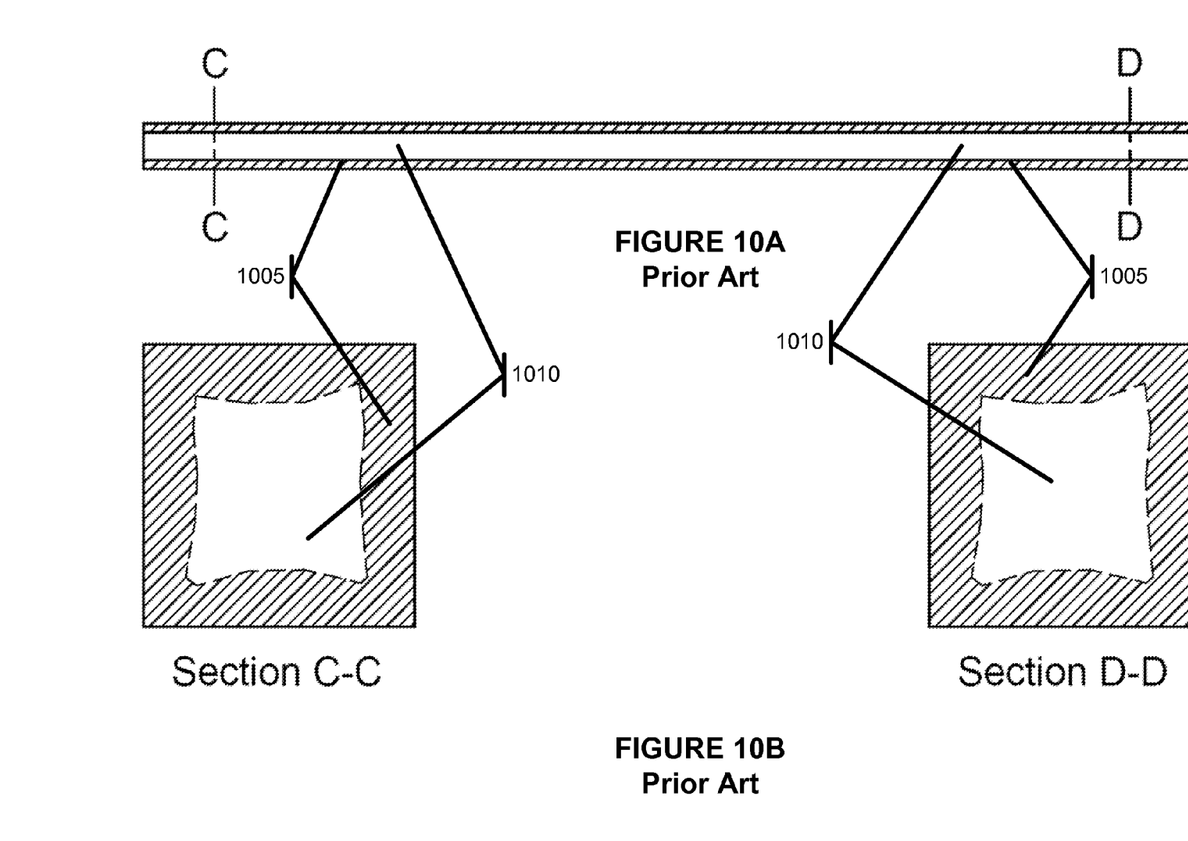
FIGS. 10A and 10B are a length-wise cross-section and width-wise cross-sections, respectively, of the stresses experienced by the torsion element of a torsional probe.

Finally, the torsional design more efficiently distributes stress across the entire volume of the torsion element. FIG. 10A illustrates a length-wise cross-sectional view of the stresses experienced by the torsion element, while FIG. 10B illustrates the width-wise cross-sectional views (Sections C-C and D-D) of the stresses at each end of the element. The area of the torsion element that experiences stresses that are greater than 50% of the maximum stress is shown hatched area (1005), with the center of the torsion element (1010) experiencing the least amount of stress. The corresponding volume of the torsion element that experiences greater than 50% of maximum stress is about 60% of the total torsion element volume. Unlike a cantilever design, this stress is experienced throughout the entire length of the torsion element, and it is not localized at the probe base. It is therefore more efficient to make the width of the torsion bar uniform, thereby also improving the packing density.

Figure 11A:
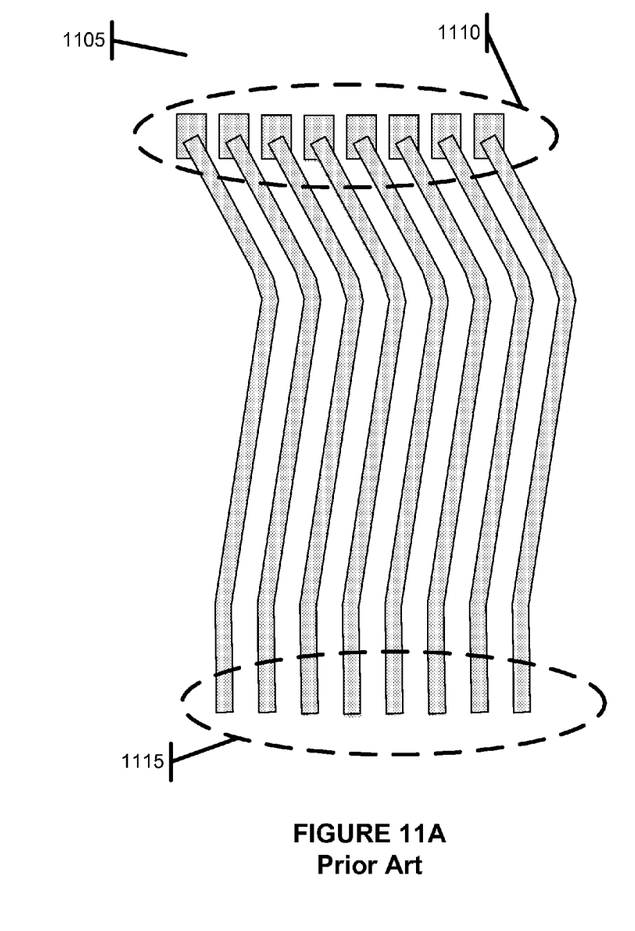
Figure 11B:
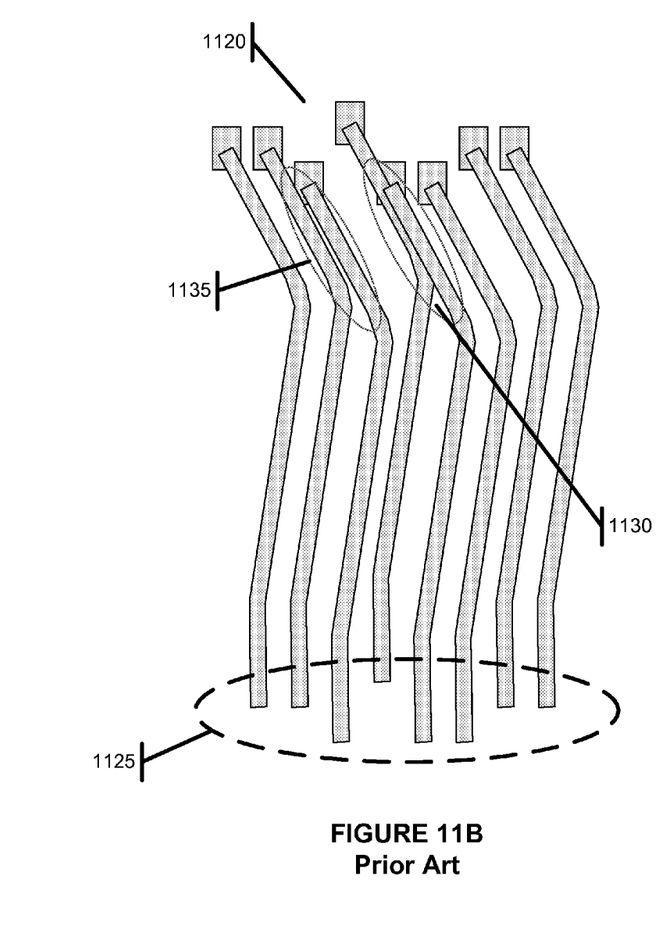

Unfortunately, the torsional probe too has drawbacks. First, for a typical torsional design with a shorter geometry of the arm, the scrub length is generally longer which can limit the size of contact pads for the DUTs. Second, again because of the typically shorter geometry of the arm, a large torsional force is required for larger z-displacement of the probe tip during probing. This large torsion may result in small z-deformation in the torsion element caused by material fatigue, which can translate into a z-shift. Third, the torsional probe also limits packing density in some DUT layout configurations. To illustrate, FIG. 11A presents a torsional probe configuration (1105) with the probe base (1110) and probe tips (1115). In this configuration, a probe card can effectively test a DUT that has a contact pad configuration that matches the probe tip configuration. In FIG. 11B, a new probe configuration (1120) is presented which has a different probe tip configuration (1125). However, this configuration would not work because in at least two areas (1130 and 1135) the probes will obstruct each other and prevent the probe card from operating efficiently.

What is needed, therefore, is a probe that exploits the advantages of both the torsional and cantilever probe designs while reducing their associated shortcomings.

3. SUMMARY OF THE INVENTION

The present disclosure provides a novel forked probe design that addresses the shortcomings of the prior art by allowing the probe to store the displacement energy more efficiently. Specifically, the novel probe card comprising a substrate and a forked probe connected to the substrate. The forked probe includes a base that is connected to the substrate and a forked bending element connected to the base, wherein the forked bending element comprises at least a first prong connected to a second prong through a prong connecting structure, and the prong connecting structure is connected to a handle. Connected to the first prong is the probe tip that is adapted to make contact with the DUT. Refinements to the probe card include that the first and second prongs and the handle are adapted to bend such that they elastically store the displacement energy when the probe tip contacts the DUT. Also, the forked bending element may be manufactured using photolithography and using layered photolithography. Each prong may be comprised of different materials. And the forked bending element may be comprised of a nickel alloy. Also, the first prong may be constructed to be stiffer than the second prong, which may yield a shorter scrub length. The stiffness of the prongs may be manipulated by altering their geometry and/or material composition.

In one embodiment, the substrate may also include a pivot, wherein the second prong contacts the pivot while the probe tip contacts the DUT.

In another embodiment, the forked bending element is connected to the base through the second prong. This embodiment may further comprise a pivot connected to the substrate, wherein the forked bending element contacts the pivot through the handle while the probe tip contacts the DUT.

In another embodiment, the forked bending element is connected to the base through the handle. This embodiment may further comprise a pivot connected to the substrate, wherein the second prong contacts the pivot while the probe tip contacts the DUT.

In yet another embodiment, a pivot is connected to the second prong, wherein the pivot contacts the substrate while the probe tip contacts the DUT.

Also disclosed is a novel forked probe design that comprises a base that is adapted to be connected to a substrate and a forked bending element connected to the base. The forked bending element comprises at least a first prong connected to a second prong, through a prong connecting structure, and the prong connecting structure is connected to a handle. A probe tip is connected to the first prong. Refinements to the forked probe include that the first and second prongs and the handle are adapted to bend such that they elastically store the displacement energy when the probe tip contacts the DUT. Also, the forked bending element may be manufactured using photolithography and using layered photolithography. Each prong may be comprised of different materials. And the forked bending element may be comprised of a nickel alloy.

In one embodiment, the forked bending element is connected to the base through the second prong. In another embodiment, the forked bending element is connected to the base through the handle. In yet another embodiment, a pivot is connected to the second prong or to the handle.

5. DETAILED DESCRIPTION OF THE PREFERRED EMBODIMENTS

What is described below is a novel forked probe design that comprises a forked bending element. This element allows the forked probe to store the displacement energy more efficiently throughout more volume of the probe structure. The forked probe has the advantage of greater packing density, less probe failure from material fatigue, less probe card force, and shorter scrub lengths. The forked probe design can be manipulated to optimize a particular application, further increasing the probe card efficiency and cost effectiveness.

Figure 1:
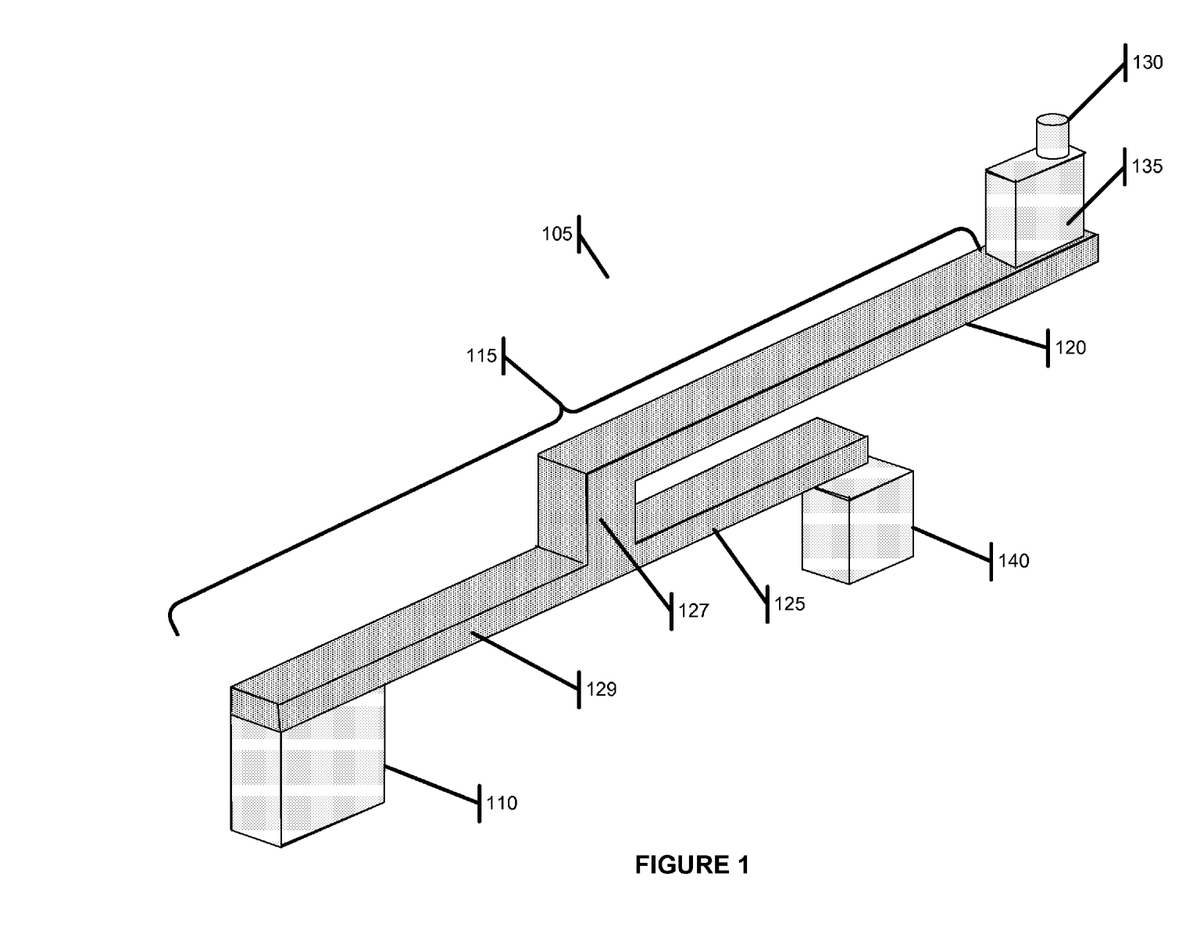
FIG. 1 illustrates an embodiment of a novel forked probe design.

FIG. 1 presents an embodiment of a novel forked probe (105). The forked probe (105) comprises a probe base (110) connected to the substrate (not shown) and a forked bending element (115) (shaded for illustration purposes). The forked bending element (115) can best be visualized as a table fork that includes at least two prongs (120) and (125), a prong connecting structure (127) between the prongs and a handle (129) that connects to the probe base (110) and the prong connecting structure (127). A probe tip (130) is connected to a first prong (120) through a probe post (135). Connected to the substrate is a pivot (140) (also known as a stop) which is placed at a distance from the second prong (125). Because of the perspective of FIG. 1, the small gap between the pivot (140) and the second prong (135) is not visible.

Figure 2A:
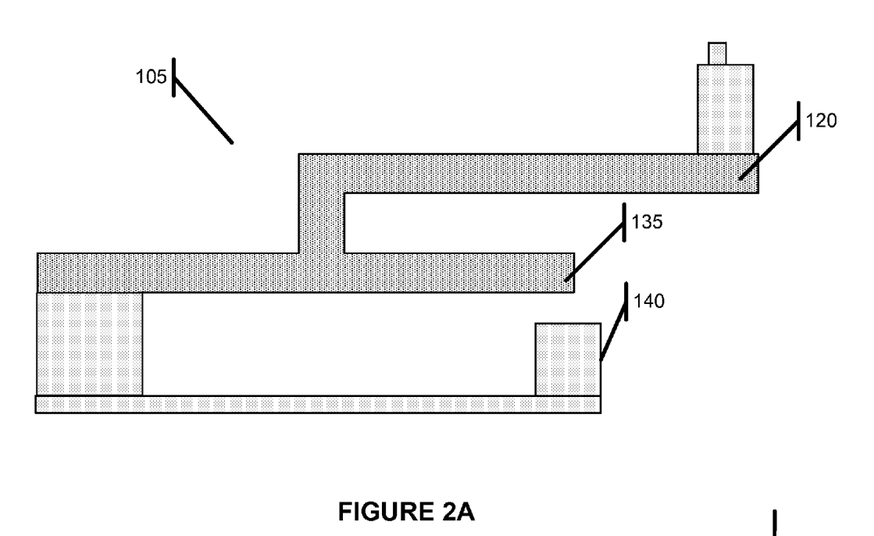
FIGS. 2A and 2B illustrate the embodiment of FIG. 1 in both the unengaged and engaged (i.e., when the probe tip contacts the DUT) configurations.
Figure 2B:
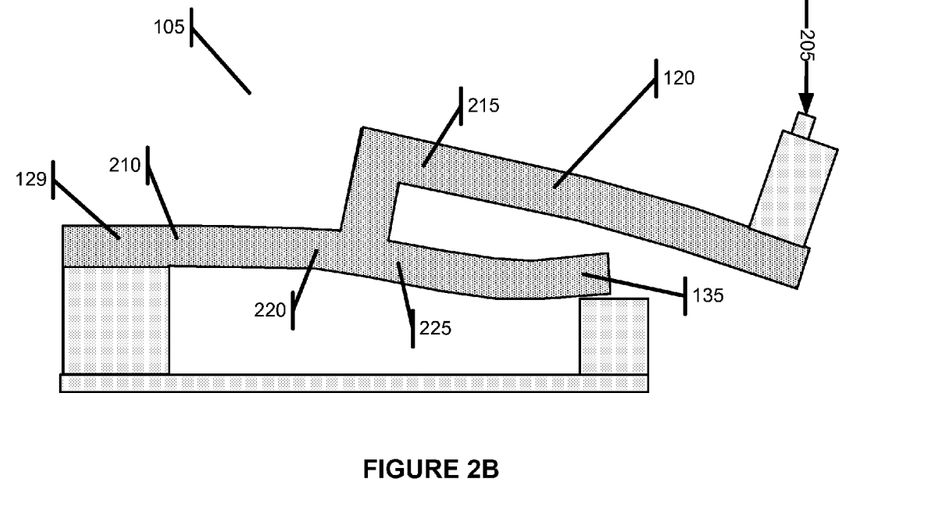

FIGS. 2A and 2B illustrate the same embodiment portrayed in FIG. 1. FIG. 2A is a side view of the forked probe (105) in the unengaged configuration—i.e., the probe tip is not in contact with a DUT. From this perspective, the gap between the pivot (140) and the second prong (135) is visible. In FIG. 2B the forked probe (105) is in the engaged configuration (i.e., in contact with the DUT) such that a force (205) is imparted on the probe tip. The force (205) causes the forked bending element to bend, thus elastically storing the displacement energy. Because of the geometry of the forked bending element, the energy is more evenly distributed than in a simple cantilever design. Specifically, the probe (105) distributes the energy throughout the forked bending element (shaded) including the first prong (120) at location 215, the second prong (135) at location 225, and the handle (129) at locations 220 and 210. The benefit of more even distribution of stress is that the probe need not be reinforced with extra material to operate effectively as in the simply cantilever design; thus the forked probe (105) allows for a much more efficient and favorable packing density.

Another advantage of the forked probe design is that the scrub length is short compared to a torsional probe. Referring to FIG. 2A, when the probe (105) is engaged but before the second prong (135) contacts the pivot (140), the probe (105) acts like a cantilever with respect to scrub length. Once the second prong (135) hits the pivot (140), the second prong (135) begins to slide across the pivot (140), causing a slight translation movement to the probe tip. The movement of the probe tip (and consequently scrub length), however, is much smaller than that of a torsional probe design. Thus, the forked probe lends itself to a higher packing density than a torsional probe design.

The scrub length can be further fine tuned by manipulating both the material composition and/or geometry of the prongs. For example, in FIG. 2A, the second prong (135) could be made stiffer than the first prong (120) which would yield a short scrub length. The benefit to a shorted scrub length is that it allows for testing die with smaller contact pads. Conversely, the second prong (135) could be made less stiff than the first prong (120) which would yield a long scrub length. Stiffness of each prong can be manipulated by selecting an appropriate material. A material with a low Young's Modulus is more pliable and thus less stiff. A higher Young's Modulus is stiffer. The stiffness adjustment can also be realized by making the prong longer and/or thinner, thus making it less stiff; conversely the construction could be shorter, thicker and/or wider making it stiffer. The same manipulations can be made to the forked bending element handle.

The forked probe may be constructed using several techniques, including those described in U.S. patent application Ser. Nos. 11/019,912 and 11/102,982, both commonly owned by the present applicant and hereby also incorporated by reference. Those two applications describe the use of general photolithographic pattern-plating techniques combined with the use of sacrificial metals to further create microstructures such as probes. The probes may be manufactured using several types of materials. The most common of which are nickel alloys that are high performance and preferably plateable. Such alloys may include NiCo and NiMn, with NiMn being more pliable—i.e., the lowest Young's Modulus.

U.S. patent application Ser. No. 11/194,801 teaches forming different parts of the probe during different layers of photolithography, a feature made possible using the photolithography process described in U.S. application Ser. Nos. 11/019,912 and 11/102,982. Using this technique, it is possible to manufacture the various parts of the forked probe with different materials, which allow for further fine tuning of the hybrid probe characteristics. For example, to obtain a shorter scrub length the second prong (135) may be constructed of NiMn (more pliable), while the first prong (120) is made of NiCo (less pliable). Should one desire a longer scrub length then one could exchange this material selection.

Figure 3A:
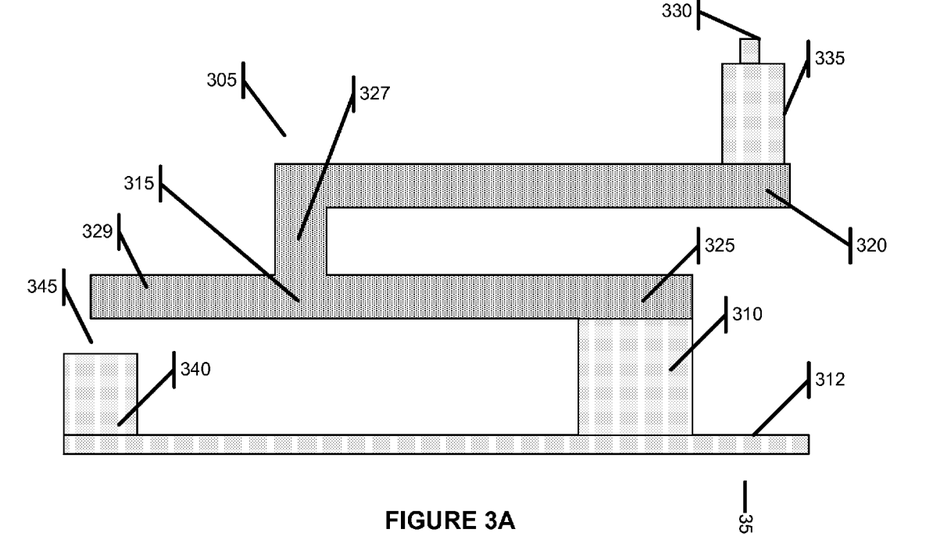
FIGS. 3A and 3B illustrate another novel forked probe design in both the unengaged and engaged (i.e., when the probe tip contacts the DUT) configurations.
Figure 3B:
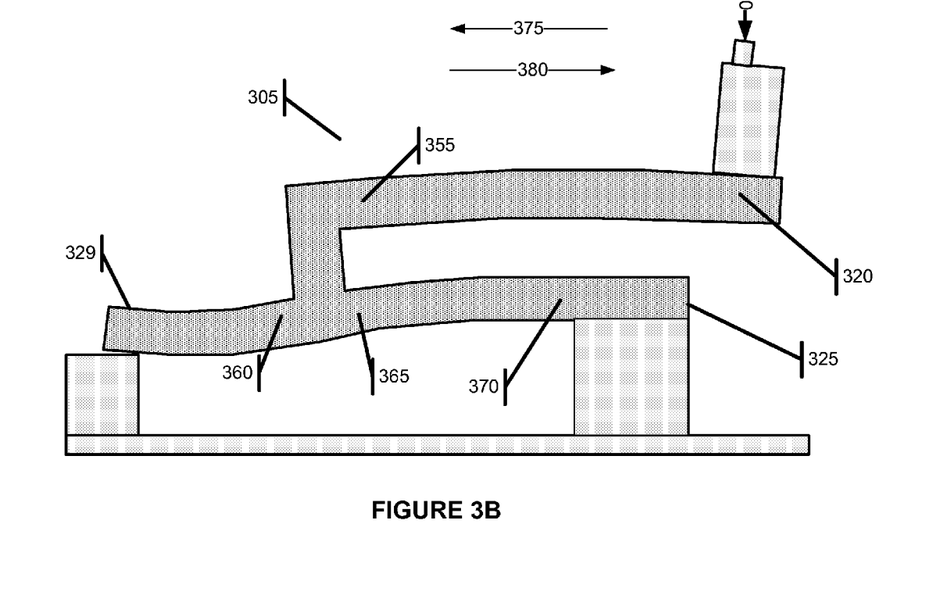
Figures 3C, 11B:
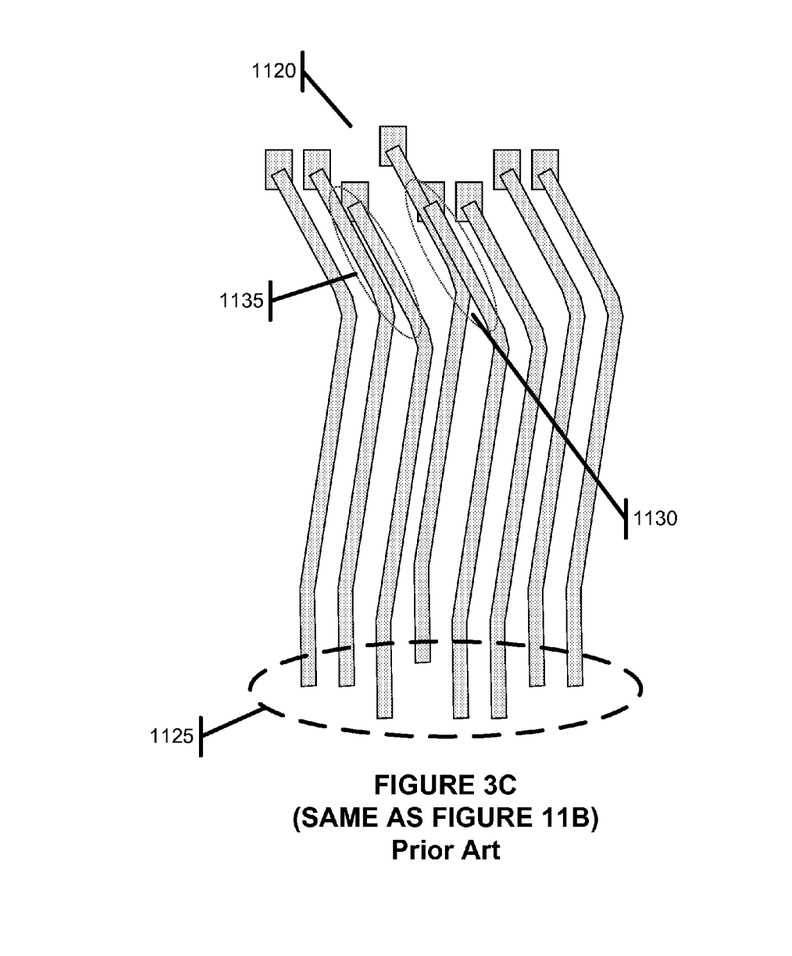
FIGS. 3C and 3D illustrate a comparison of the deficient packing density of a torsional probe configuration compared to the packing density of a forked probe configuration.
FIGS. 11A and 11B illustrate the packing density of a torsional probe configuration and the attendant inefficiencies.

FIGS. 3A and 3B present another embodiment of a novel forked probe (305). FIG. 3A is a side view of the forked probe (305) in the unengaged configuration—i.e., the probe tip is not in contact with a DUT. The forked probe (305) comprises a probe base (310) connected to the substrate (312) and a forked bending element (315) (shaded for illustration purposes). The forked bending element (315) further includes at least two prongs (320) and (325), a prong connecting structure (327) between the prongs and a handle (329) connected to the prong connecting structure (327). A probe tip (330) is connected to a first prong (320) through a probe post (335). Connected to the substrate is a pivot (340) which is placed at a distance (345) from the handle (329). Alternatively, the pivot (340) can be attached to the handle (329). In FIG. 3B the forked probe (305) is in the engaged configuration (i.e., in contact with the DUT) such that a force (350) is imparted on the probe tip. The force (350) causes the forked bending element to bend, thus elastically storing the displacement energy. As discussed above, the geometry of the forked bending element allows the energy to be more evenly distributed than in a simple cantilever design. Namely, the forked probe (305) has at least four areas that experience high stress—355, 360, 365 and 370, and those areas are spread across the first prong (320), the second prong (325) and the handle (329). By having a more evenly distributed stress profile, the forked probe (305) can operate more effectively and efficiently without the need for reinforcement or over engineering as in the simply cantilever design. Of course, forked probe (305) can be constructed with various materials and/or geometries to arrive at the performance specifications desired.

The advantage to forked probe (305) is that it has an even shorter scrub length than that described with respect to FIGS. 1 and 2 because the forked probe configuration actually changes the direction of the scrub. Referring to FIG. 3A, when the probe (305) is engaged but before the forked bending element (315) hits the pivot (340), the probe (305) acts like a cantilever with respect to scrub length. The direction of the scrub length in this first mode is shown by arrow 375. Once the forked bending element (315), through the handle (329) hits the pivot (340), the handle (329) begins to slide across the pivot (340), causing a slight translation movement to the probe tip in the direction of arrow 380; so the scrub direction changes in the second mode to traverse back over its own path. Ultimately, the scrub length is smaller than that of a conventional cantilever and much smaller than the of a torsional probe design. Thus, the forked probe (305) can be used is very high packing densities.

Figure 3D:
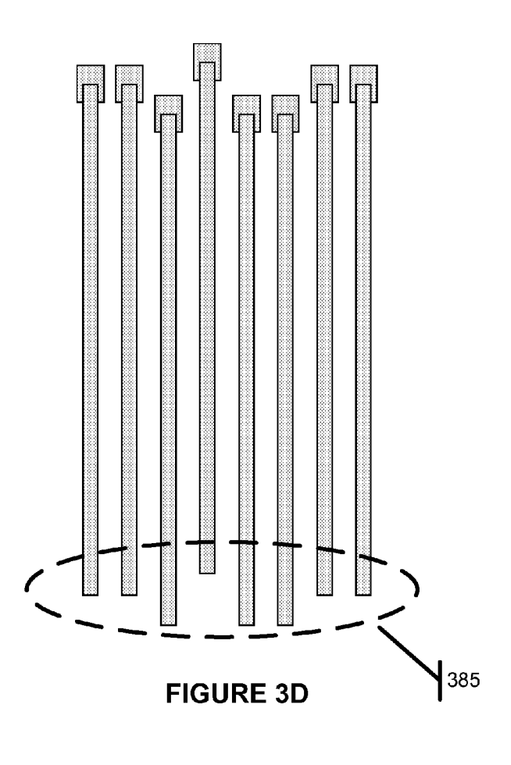

Also, the forked probe has an advantage over torsional probes. Turning to FIGS. 3C and 3D, the packing density of torsional probes is compared to the packing density of forked probes. FIG. 3C is the same figure as FIG. 11B, but is presented here for the convenience of a side by side comparison. Recall that the probe configuration (1120) would not work because in at least two areas (1130 and 1135) the probes would obstruct each other and prevent the probe card from operating efficiently. However, the same probe tip configuration can be achieved using forked probes as shown in FIG. 3D. The probe tip configuration (385) is the same as the torsional probe tip configuration (1125), but does not result in an obstruction between the probes as in the torsional design. Thus, the forked probe can accommodate more probe tip configurations than a torsional probe.

Figure 4A:
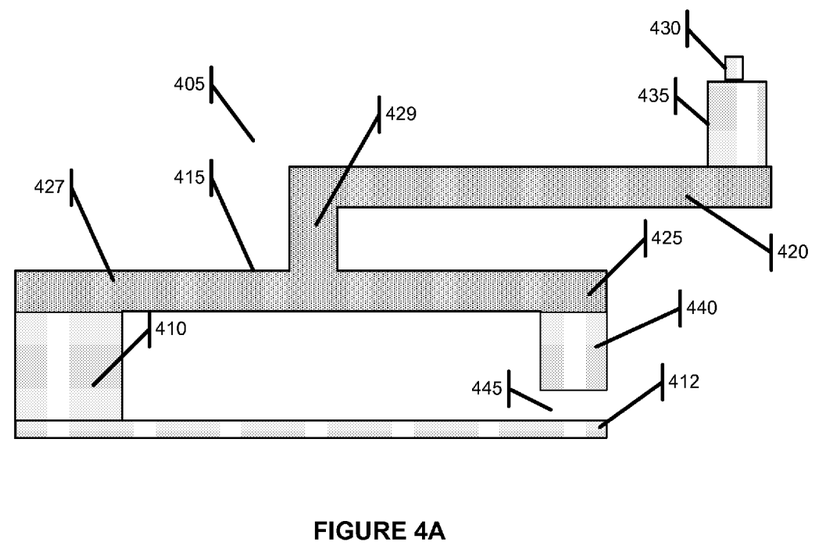
FIGS. 4A and 4B illustrate yet another novel forked probe design in both the unengaged and engaged (i.e., when the probe tip contacts the DUT) configurations.
Figure 4B:
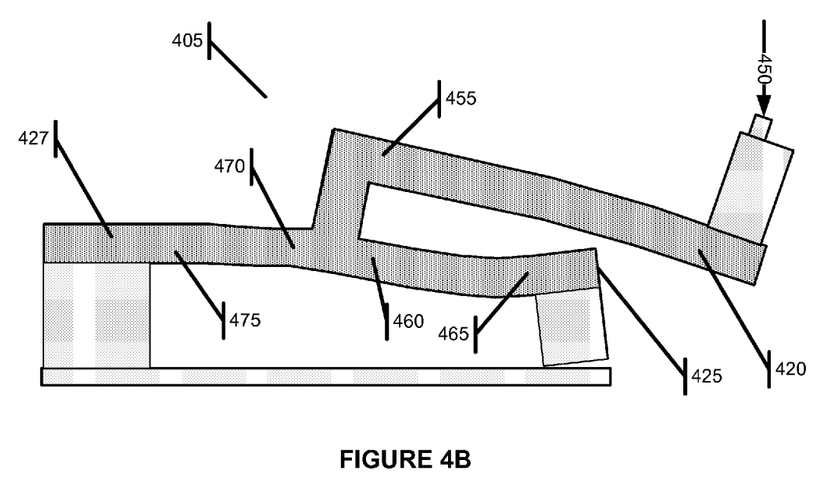

FIGS. 4A and 4B present yet another embodiment of a novel forked probe (405). FIG. 4A is a side view of the forked probe (405) in the unengaged configuration—i.e., the probe tip is not in contact with a DUT. The forked probe (405) comprises a probe base (410) connected to the substrate (412) and a forked bending element (415) (shaded for illustration purposes). The forked bending element (415) further includes at least two prongs (420) and (425), a prong connecting structure (427) between the prongs and a handle (429) that is connected to the probe base (410) and the prong connecting structure (427). A probe tip (430) is connected to a first prong (420) through a probe post (435). Connected to the second prong (425) is a pivot (440) which is placed at a distance (445) from the substrate (412). Although not shown in this figure, it is possible to have a second pivot on the substrate, such that the pivot (440) may come into contact with the second pivot. In FIG. 4B the forked probe (405) is in the engaged configuration (i.e., in contact with the DUT) such that a force (450) is imparted on the probe tip. The force (450) causes the forked bending element to bend, thus elastically storing the displacement energy. As discussed above, the geometry of the forked bending element allows the energy to be more evenly distributed than in a simple cantilever design. Specifically, the forked probe (405) has five areas that experience high stress throughout the forked probe bending element (415)—the first prong (420) experiences high stress at location 455, the second prong (425) experiences high stress a locations 460 and 465, and the handle (427) experiences high stress at locations 470 and 475. By having a more evenly distributed stress profile, the forked probe (405) can operate more effectively and efficiently without the need for reinforcement or over engineering as in the simply cantilever design.

Figure 5A:
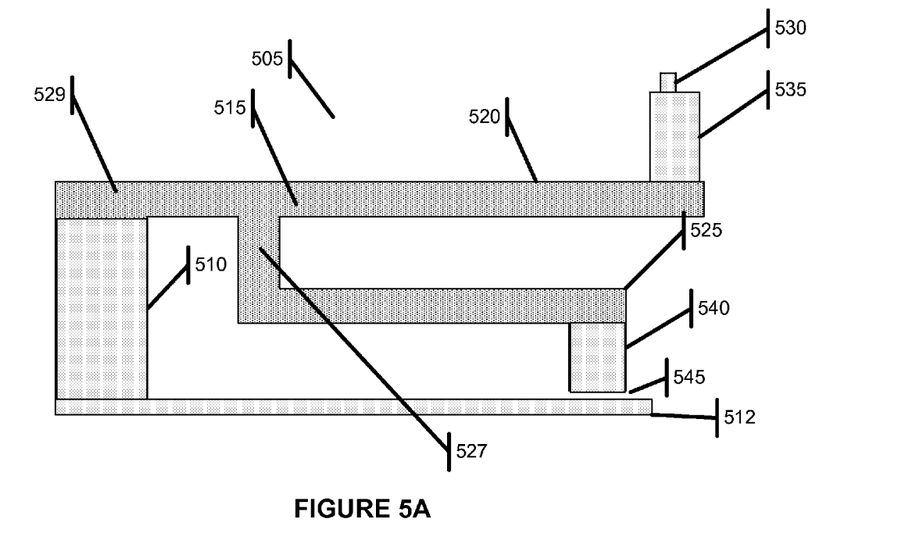
FIGS. 5A and 5B illustrate yet another novel forked probe design in both the unengaged and engaged (i.e., when the probe tip contacts the DUT) configurations.
Figure 5B:
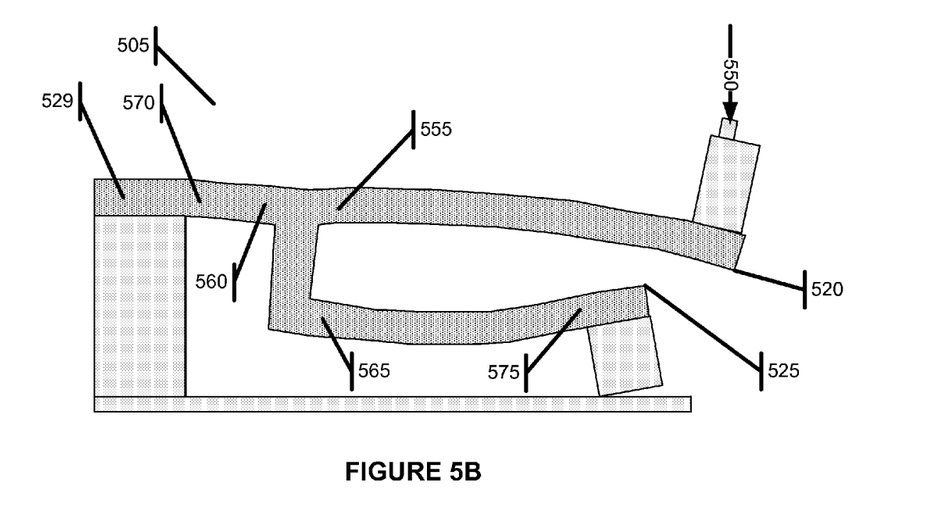

FIGS. 5A and 5B present yet another embodiment of a novel forked probe (505), which is similar to the embodiment just described. FIG. 5A is a side view of the forked probe (505) in the unengaged configuration—i.e., the probe tip is not in contact with a DUT. The forked probe (505) comprises a probe base (510) connected to the substrate (512) and a forked bending element (515) (shaded for illustration purposes). The forked bending element (515) further includes at least two prongs (520) and (525), a prong connecting structure (527) between the prongs and a handle (529) that is connected to both the probe base (510) and the prong connecting structure (527). A probe tip (530) is connected to a first prong (520) through a probe post (535). Connected to the second prong (525) is a pivot (540) which is placed at a distance (545) from the substrate (512). Although not shown in this figure, it is possible to have a second pivot on the substrate, such that the pivot (540) may come into contact with the second pivot. In FIG. 5B the forked probe (505) is in the engaged configuration (i.e., in contact with the DUT) such that a force (550) is imparted on the probe tip. The force (550) causes the forked bending element to bend, thus elastically storing the displacement energy efficiently throughout the forked probed (505). Specifically, the forked probe (505) has five areas that experience high stress—555, 560, 565, 570 and 575. And each of these areas of high stress are stored throughout the forked bending element structure including in the first prong (520) (location 555), the second prong (525) (locations 565 and 575) and the handle (529)(locations 560 and 570). As with all the embodiments described herein, the forked probe (505) can be constructed with various geometries and various materials to arrive at the desired performance specification.

By using the embodiments described herein, it is possible to manufacture a forked probe that exploits the advantages of the torsional designs—i.e., more even distribution of stress and packing density—with the advantages of a simple cantilever design—i.e., shorter scrub lengths. The benefit of forked probe is that the probe more efficiently absorbs the displacement energy across more of the probe's volume, thus reducing the need to reinforce the probe. Also, by manipulating the stiffness of prongs that comprise the forked bending element, the scrub length can be shortened. Manipulating the structure of the forked probe can also change direction of the scrub. This results in a probe card that is more efficient and cost effective with higher packing densities, lower failure rates and less probe failure due to material fatigue from excessive stress. Fine tuning the forked probe through geometry of the prongs and the material composition, allows for customization to particular applications that further increase the probe card's efficiency and cost effectiveness.

While the description above refers to particular embodiments of the present invention, it should be readily apparent to people of ordinary skill in the art that a number of modifications may be made without departing from the spirit thereof. The accompanying claims are intended to cover such modifications as would fall within the true spirit and scope of the invention. The presently disclosed embodiments are, therefore, to be considered in all respects as illustrative and not restrictive, the scope of the invention being indicated by the appended claims rather than the foregoing description. All changes that come within the meaning of and range of equivalency of the claims are intended to be embraced therein. Moreover, the applicants expressly do not intend that the following claims "and the embodiments in the specification to be strictly coextensive." *Phillips v. AHW Corp.*, 415 F.3d 1303, 1323 (Fed. Cir. 2005) (en banc).

The invention claimed is:

1. A probe card for testing a semiconductor device, comprising:
   a substrate;

a forked probe connected to the substrate, the forked probe comprising:
   a base that is connected to the substrate;
   a forked bending element connected to the base, wherein the forked bending element comprises
     at least a first prong connected to a second prong through a prong connecting structure, wherein the first and second prongs extend away from the prong connecting structure in a first direction; and
     a handle connected to the prong connecting structure, wherein at least a portion of the handle extends away from the prong connecting structure in a second direction that is opposite to the first direction and wherein the portion of the handle connects to the base; and
   a probe tip connected to the first prong.

2. The probe card of claim 1, wherein the first and second prongs and the handle are adapted to bend such that the prongs and the handle elastically store the displacement energy when the probe tip contacts the device.

3. The probe card of claim 1 further comprising a pivot connected to the substrate, wherein the second prong contacts the pivot while the probe tip contacts the device.

4. The probe card of claim 1 further comprising a pivot connected to the substrate, wherein the second prong contacts the pivot while the probe tip contacts the device.

5. The probe card of claim 1 further comprising a pivot connected to the second prong, wherein the pivot contacts the substrate while the probe tip contacts the device.

6. The probe card of claim 1 wherein the forked bending element is manufactured using photolithography.

7. The probe card of claim 1 wherein the first prong is manufactured using a first photolithographic layer, and the second prong is manufactured using a second photolithographic layer.

8. The probe card of claim 1 wherein the first prong is comprised of a first material and the second prong is comprised of a second material.

9. The probe card of claim 1, wherein the forked bending element is comprised of a nickel alloy.

10. The probe card of claim 1, wherein the stiffness of the first prong relative to the second prong is selected to achieve a short scrub length.

11. The probe card of claim 1, wherein the length of the first prong relative to the length of the second prong is selected to achieve a short scrub length.

12. The probe card of claim 1, wherein the first prong is stiffer than the second prong.

13. The probe card of claim 12, wherein the stiffness of the first prong is achieved by altering a characteristic of the first prong, wherein the characteristic selected from a group consisting of: geometry, material and combinations thereof.

14. A forked probe for testing a semiconductor device, comprising:
   a base that is adapted to be connected to a substrate;
   a forked bending element connected to the base, wherein the forked bending element comprises
     at least a first prong connected to a second prong through a prong connecting structure, wherein the first and second prongs extend away from the prong connecting structure in a first direction; and
     a handle connected to the prong connecting structure, wherein at least a portion of the handle extends away from the prong connecting structure in a second direction that is opposite to the first direction and wherein the portion of the handle connects to the base; and
   a probe tip connected to the first prong.

15. The forked probe of claim 14, wherein the first and second prongs and the handle are adapted to bend such that the prongs and the handle elastically store the displacement energy when the probe tip contacts the device.

16. The probe card of claim 14 further comprising a pivot connected to the second prong.

17. The forked probe of claim 14, wherein the forked bending element is manufactured using photolithography.

18. The forked probe of claim 14, wherein the first prong is manufactured using a first photolithographic layer, and the second prong is manufactured using a second photolithographic layer.

19. The forked probe of claim 14, wherein the first prong is comprised of a first material and the second prong is comprised of a second material.

20. The forked probe of claim 14, wherein the forked bending element is comprised of a nickel alloy.

21. The forked probe of claim 14, wherein the stiffness of the first prong relative to the second prong is selected to achieve a short scrub length.

22. The forked probe of claim 14, wherein the length of the first prong relative to the length of the second prong is selected to achieve a short scrub length.

23. The forked probe of claim 14, wherein the first prong is stiffer than the second prong.

24. The forked probe of claim 23, wherein the stiffness of the first prong is achieved by altering a characteristic of the first prong, wherein the characteristic selected from a group consisting of: geometry, material and combinations thereof.

* * * * *